(12) United States Patent
Huang et al.

(10) Patent No.: US 10,276,545 B1
(45) Date of Patent: Apr. 30, 2019

(54) SEMICONDUCTOR PACKAGE AND MANUFACTURING METHOD THEREOF

(71) Applicant: Powertech Technology Inc., Hsinchu County (TW)

(72) Inventors: Kun-Yung Huang, Hsinchu County (TW); Chi-Liang Pan, Hsinchu County (TW); Jing-Hua Cheng, Hsinchu County (TW); Bin-Hui Tseng, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/936,444

(22) Filed: Mar. 27, 2018

(51) Int. Cl.
| | |
|---|---|
| *H01L 21/00* | (2006.01) |
| *H01L 25/065* | (2006.01) |
| *H01L 23/49* | (2006.01) |
| *H01L 23/00* | (2006.01) |

(52) U.S. Cl.
CPC .......... *H01L 25/0657* (2013.01); *H01L 23/49* (2013.01); *H01L 24/32* (2013.01); *H01L 24/48* (2013.01); *H01L 2224/32145* (2013.01); *H01L 2224/48145* (2013.01); *H01L 2225/0651* (2013.01); *H01L 2225/06506* (2013.01); *H01L 2924/14* (2013.01); *H01L 2924/1811* (2013.01)

(58) Field of Classification Search
CPC .. H01L 25/0657; H01L 21/56; H01L 23/3157
See application file for complete search history.

(56) References Cited

U.S. PATENT DOCUMENTS

| | | | | |
|---|---|---|---|---|
| 8,664,780 | B2 * | 3/2014 | Han | H01L 21/561 257/678 |
| 2006/0017148 | A1 * | 1/2006 | Lee | H01L 23/3135 257/686 |
| 2009/0212409 | A1 * | 8/2009 | Kang | H01L 25/105 257/686 |
| 2013/0049221 | A1 * | 2/2013 | Han | H01L 23/3135 257/774 |
| 2013/0099393 | A1 | 4/2013 | Jeong et al. | |
| 2018/0342481 | A1 * | 11/2018 | Lee | H01L 25/18 |

FOREIGN PATENT DOCUMENTS

| | | |
|---|---|---|
| CN | 103515361 | 1/2014 |
| TW | I415201 | 11/2013 |

* cited by examiner

*Primary Examiner* — Nicholas J Tobergte
(74) *Attorney, Agent, or Firm* — JCIPRNET

(57) ABSTRACT

A semiconductor package including a chip stack, at least one conductive wire, a first insulating encapsulant, a second insulating encapsulant, and a redistribution layer is provided, and a manufacturing method thereof is also provided. The chip stack includes semiconductor chips stacked on top of each other. Each semiconductor chip has an active surface that has at least one bonding region, and each bonding region is exposed by the chip stack. The conductive wire is correspondingly disposed on the bonding region. The first insulating encapsulant encapsulates the bonding region and the conductive wire. At least a portion of each conductive wire is exposed from the first insulating encapsulant. The second insulating encapsulant encapsulates the chip stack and the first insulating encapsulant. The first insulating encapsulant is exposed from the second insulating encapsulant. The redistribution layer is disposed on the first and second insulating encapsulant and electrically coupled to the conductive wire.

20 Claims, 21 Drawing Sheets

SEMICONDUCTOR PACKAGE AND MANUFACTURING METHOD THEREOF

BACKGROUND OF THE INVENTION

Field of the Invention

The disclosure relates to the field of semiconductor package and a manufacturing method thereof, and more particularly, to a thin fan-out multi-chip stacked semiconductor package and a manufacturing method thereof.

Description of Related Art

In the known multi-chip stack package structure, a plurality of semiconductor chips is stacked upward on a substrate one by one. The active surfaces of the chips face upward and the complete bonding wires formed by wiring bonding electrically connect the chips to the substrate. In general, the bonding threads of the bonding wires are bonded to bonding pads of the chips, the wire ends of the bonding wires are bonded to contact fingers of the substrate, and the wire segments of the bonding wires are arc-shaped. However, the multi-chip stack package structure formed by this method would at least require the thickness of the substrate and the height of the wiring arc. In other words, the total thickness of the multi-chip stack package structure cannot be reduced. In particular, in situations requiring long bonding wires, issues such as short-circuit caused by wire sweep may occur easily during the step of forming an encapsulant.

Moreover, one method of producing thinner multi-chip stack package structure involves grinding or thinning the molding compound prior to forming the redistribution layer. However, the grinding process poses undesirable residual of molding compound left on the top surfaces of the bonding wires. Such insulating residual negatively affects the subsequent processes (e.g. forming the redistribution layer thereon) and also results in decreasing the resistance and fusing current of the product. As such, miniaturizing the semiconductor package while alleviating the issue of wire sweep and eliminating the issue of insulating residual left on the top surfaces of the bonding wires has become a challenge to researchers in the field.

SUMMARY OF THE INVENTION

To solve the above issues, the disclosure provides a semiconductor package and a manufacturing method thereof capable of alleviating the issue of wire sweep of vertical bonding wires in a specific package type and eliminating the issue of insulating residual left on the top surfaces of the bonding wires.

The disclosure discloses a semiconductor package including a chip stack, at least one conductive wire, a first insulating encapsulant, a second insulating encapsulant and a redistribution layer. The chip stack includes a plurality of semiconductor chips stacked one top of each other. Each of the semiconductor chips has an active surface. The active surface has at least one bonding region, and each of the at least one bonding region is exposed by the chip stack. The at least one conductive wire is correspondingly disposed on the at least one bonding region. The first insulating encapsulant encapsulates the at least one bonding region and the at least one conductive wire. The second insulating encapsulant encapsulates the chip stack and the first insulating encapsulant. The first insulating encapsulant is exposed from the second insulating encapsulant. The redistribution layer is disposed on the first insulating encapsulant and the second insulating encapsulant. The redistribution layer is electrically coupled to the at least one conductive wire.

The disclosure also discloses a manufacturing method of a semiconductor package. The manufacturing method includes at least the following steps. First, a chip stack is provided. The chip stack includes a plurality of semiconductor chips stacked on top of each other, each of the semiconductor chips has an active surface. The active surface has at least one bonding region, and each of the at least one bonding region is exposed by the chip stack. Next, at least one conductive wire is correspondingly foil ied on the bonding region. Next, a first insulating encapsulant is formed to encapsulate the bonding region and the conductive wire. Next, a second insulating encapsulant is formed to encapsulate the chip stack and the first insulating encapsulant. The first insulating encapsulant is exposed from the second insulating encapsulant. Next, a redistribution layer is formed on the second insulating encapsulant and the second insulating encapsulant. The redistribution layer is electrically coupled to the conductive wire.

Through the above technical means, the disclosure is able to achieve the semiconductor package miniaturization. The overall package thickness is very close to the chip stack height. Moreover, the first insulating encapsulant is formed to encapsulate the conductive wires formed on the active surfaces of the semiconductor chips prior to forming the second insulating encapsulant. Therefore, the first insulating encapsulant may protect the conductive wires from resulting in the issue of wire sweep. In addition, due to the material property of the first insulating encapsulant, the redundant of the first insulating encapsulant can be easily removed such that the issue of insulating residual left on the top surfaces of the conductive wires may be eliminated. Accordingly, the fabrication of the semiconductor package would result in better stability and yield.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

In the following, embodiments of the disclosure are described in detail with reference to figures. However, it should be mentioned that, the figures are all simplified schematics showing the basic structure or implementation of the disclosure in an illustrative manner. Therefore, only components and combinations pertinent to the present application are shown, and the components shown in the figures are not drawn to scale in terms of the number, shape, and size of actual implementation. Certain size ratios and other relating size ratios are exaggerated or simplified to provide a clearer description. The number, shape, and size ratio of actual implementation are open designs, and the detailed component layout may be more complicated.

Figure 1A:
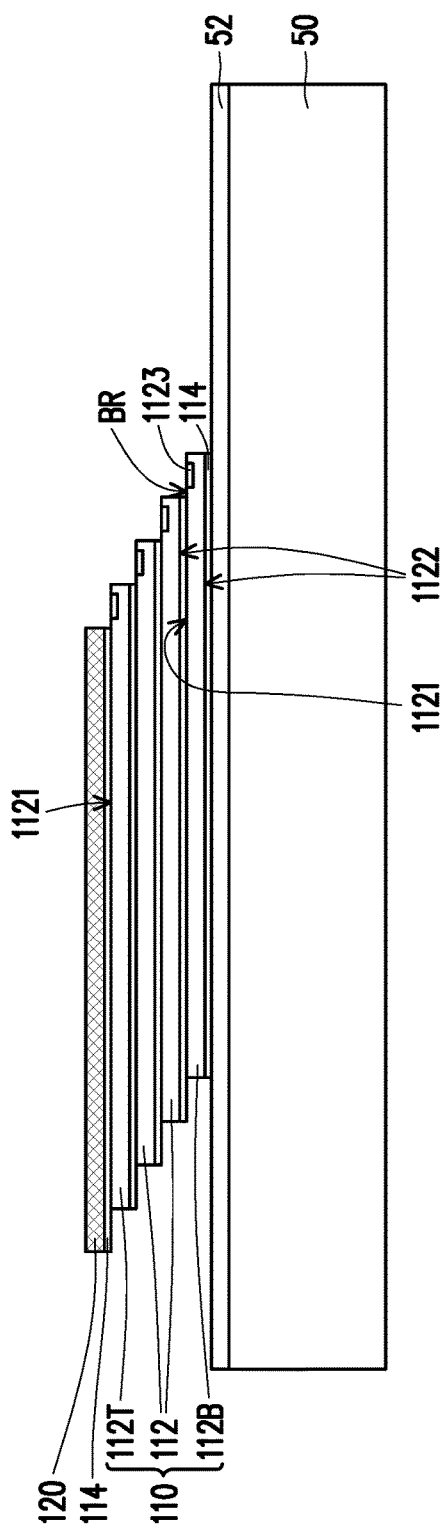
FIG. 1A to FIG. 1H are cross-sectional views illustrating a manufacturing method of a semiconductor package according to an embodiment of the disclosure.

FIG. 1A to FIG. 1H are cross-sectional views illustrating a manufacturing method of a semiconductor package according to an embodiment of the disclosure. Referring to FIG. 1A, a chip stack 110 is provided on a temporary carrier 50. For example, the chip stack 110 includes a plurality of semiconductor chips 112. Each semiconductor chip 112 may be disposed one by one through pick-and-place method. In the present embodiment, the semiconductor chips 112 may be stacked on top of each other (e.g. stacked in a stepped offset manner or staggered stacking). In some other embodiments, the semiconductor chips 112 may be stacked in a manner of a cross, a tower, or the like. The number of the semiconductor chips 112 may be four or more. However, the number of the semiconductor chips 112 construes no limitation in the disclosure. The semiconductor chip 112 closest to the temporary carrier 50 may be referred to a bottom semiconductor chip 112B and the semiconductor chip 112 most far away from the temporary carrier 50 may be referred to a top semiconductor chip 112T. Each of the semiconductor chips 112 has an active surface 1121 facing away from the temporary carrier 50 and a back surface 1122 opposite to the active surface 1121. The active surface 1121 may have at least one bonding region BR, and the bonding region BR may be exposed by the chip stack 110. In some other embodiments, more than one bonding region BR (e.g. located at the two opposite sides of the active surface 1121) may be exposed from the semiconductor chip 112 stacked thereon. The configuration of the bonding region BR may depend on the stacking manner of the chip stack 110, but is not limited thereto.

In some embodiments, the semiconductor chips 112 are integrated circuit (IC) semiconductor devices with memory units. For example, each of the semiconductor chips 112 may include integrated circuits formed thereon and at least one electrode 1123 disposed on the bonding region BR of the active surface 1121. The electrode 1123 of each of the semiconductor chips 112 may be electrically coupled to a metal interconnect (not shown) of the integrated circuits inside the semiconductor chips 112. The electrode 1123 on the bonding region BR of one semiconductor chip 112 is not covered by another semiconductor chip 112 stacked thereon for further electrical connection. For example, when one semiconductor chip 112 is stacked on the bottom semiconductor chip 112B, the active surfaces 1121 of the bottom semiconductor chip 112B and the semiconductor chip 112 stacked thereon are partially covered. The electrode 1123 of the bottom semiconductor chip 112B is not covered by the semiconductor chip 112 stacked thereon.

In some embodiments, the chip stack 110 may include a plurality of die attach films 114 formed on a back surface 1122 of each of the semiconductor chips 112 to adhere the active surface 1121 of the underlying semiconductor chip 112. The die attach film 114 of the bottom semiconductor chip 112 may be attached to the temporary carrier 50. The temporary carrier 50 may be a wafer support system (WSS), or a panel support system (PSS), but is not limited thereto. A material for the body of the temporary carrier 50 may be silicon, glass or other suitable material which is able to withstand the subsequent processes while carrying the package structure formed thereon. The shape of the temporary carrier 50 may be a wafer or a panel, but is not limited thereto. In some embodiments, in order to enhance the releasability of the chip stack 110 from the temporary carrier 50 in the subsequent process, a release layer 52 may be formed on the temporary carrier 50. For example, the release layer 52 is a UV adhesive gel pre-fabricated on a surface of the temporary carrier 50.

Referring to FIG. 1A again, a dummy spacer 120 is disposed on the active surface 1121 of the top semiconductor chip 112T of the chip stack 110. For example, the die attach film 114 may be formed on the dummy spacer 120 to adhere the active surface 1121 of the top semiconductor chip 112T. The bonding region BR and the electrode 1123 on the bonding region BR of the top semiconductor chip 112T is exposed from the dummy spacer 120. For example, the dummy spacer 120 can be selected from one of a dummy chip or a heat-dissipating metal plate, so the dummy spacer 120 is suitable for pick-and-place operations with good heat-dissipating effect. The size and thickness of the dummy spacer 120 may be less than or equal to the unit size and unit thickness of a semiconductor chip 112, 112B, or 112T. "Dummy chip" refers to a semiconductor substrate having a similar shape or appearance as that of a semiconductor chip while not having IC active devices formed therein. In some embodiments, the dummy spacer 120 may not be disposed on the chip stack 110, and the details will be described later.

Figure 1B:
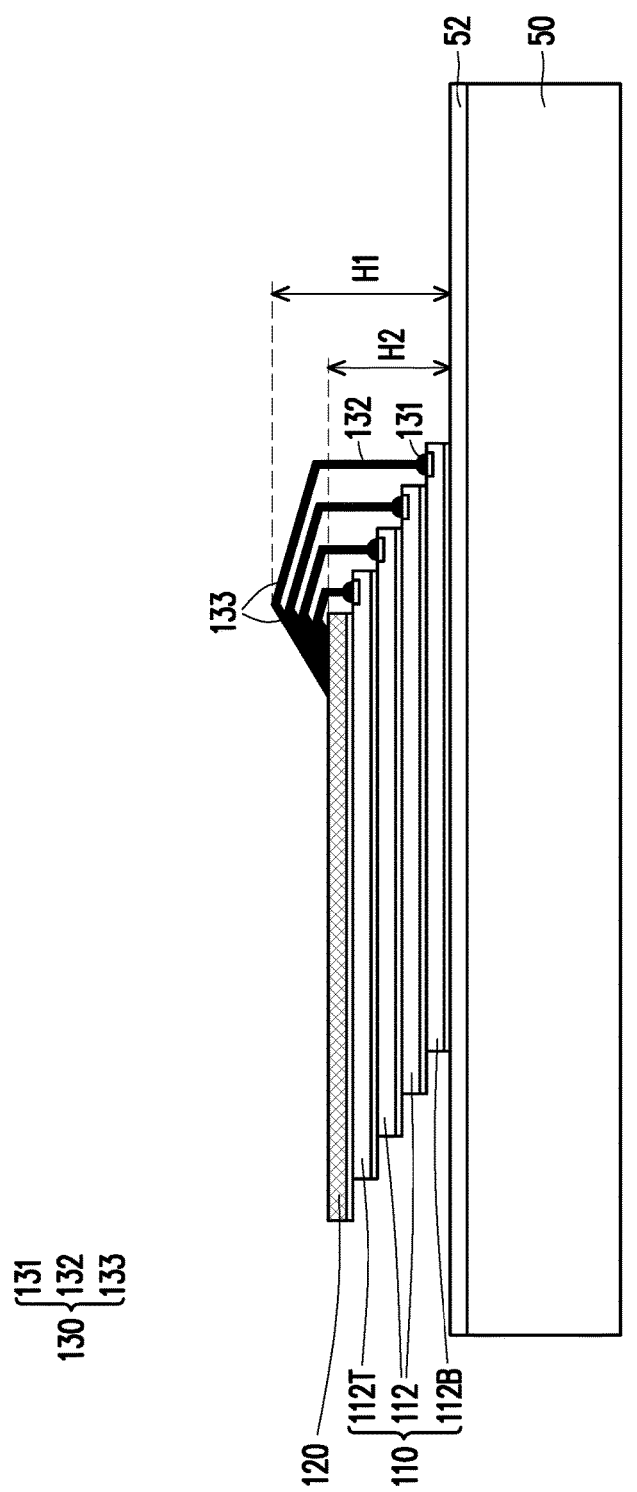

Referring to FIG. 1B, at least one conductive wire 130 is correspondingly formed on the bonding region BR. In some embodiments, a plurality of conductive wires 130 may be formed on the chip stack 110. The amount of the conductive wires depends on the design requirement and construes no limitation in the disclosure. For example, the conductive wires 130 may be formed by a wire bonding process. A material of the conductive wires 130 may include gold, copper, or other suitable conductive material. Each of the conductive wires 130 has a bonding thread 131, a vertical wire segment 132 and a sacrificial segment 133. The bonding threads 131 of the conductive wires 130 are bonded to the electrodes 1123 of the semiconductor chips 112, 112T and 112B. The sacrificial segments 133 of the conductive wires 130 are bonded to the conductive surface of the dummy spacer 120. The bonding threads 131 may be integrally connected to the corresponding sacrificial segment 133 via the vertical wire segment 132. In some embodiments, after forming the conductive wires 130, the sacrificial segments 133 protrude beyond the horizontal plane of the dummy spacer 120. For example, the distance between a peak of each the sacrificial segment 133 and the bottom of the chip stack 110 is defined as a wire arc height H1 of each of the conductive wires 130 and the distance between the conductive surface of the dummy spacer 120 where the sacrificial segments 133 are bonded and the bottom of the chip stack 110 is defined as a level height H2 of the dummy spacer 120. The wire arc height H1 of each of the conductive wires 130 is greater than the level height H2 of the dummy spacer 120.

Figure 1C:
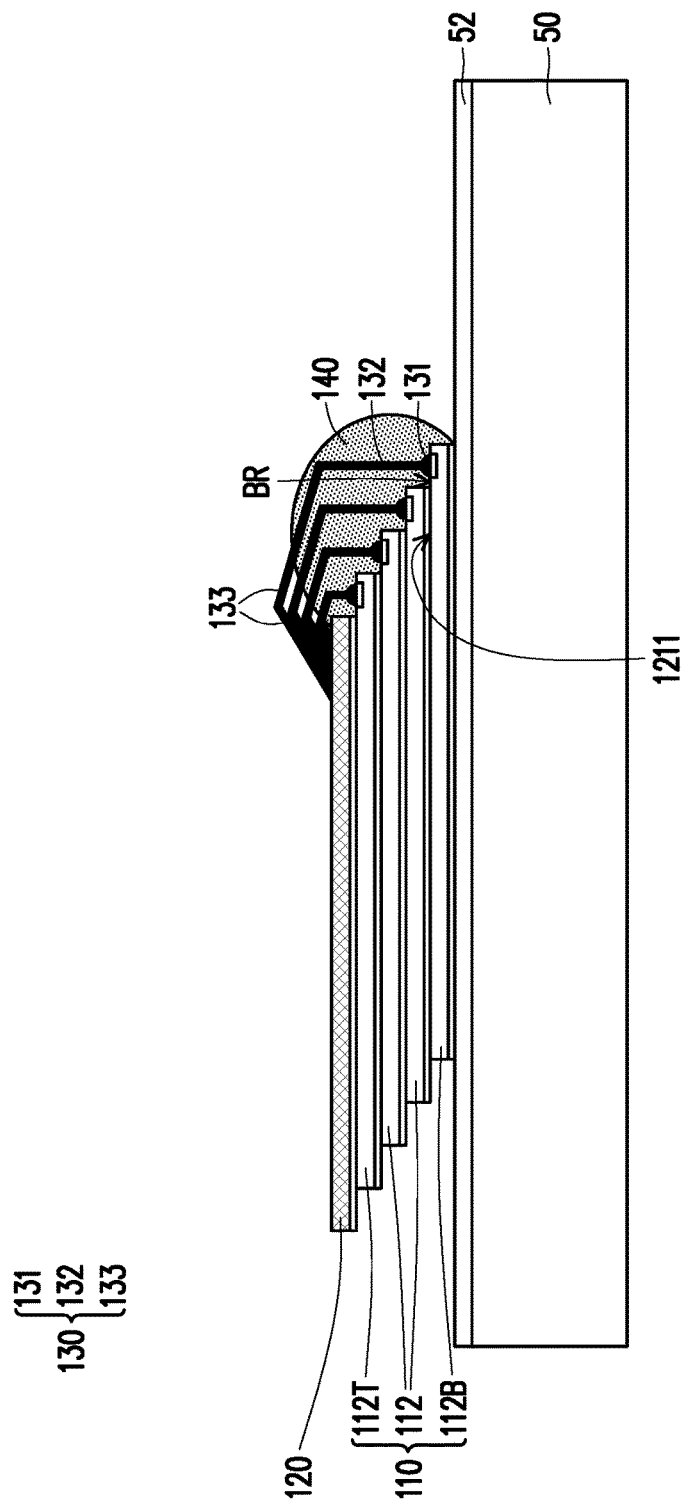

Referring to FIG. 1C, a first insulating encapsulant 140 is formed on the bonding region BR of the active surface 1121 of each of the semiconductor chips 112 to encapsulate the bonding region BR and the conductive wires 130. In some embodiments, at least the bonding threads 131 and the vertical wire segments 132 of the conductive wires 130 are encapsulated by the first insulating encapsulant 140. In some embodiments, the first insulating encapsulant 140 further covers at least a portion of the dummy spacer 120. For example, a first insulating material is disposed on the chip stack 110 by dispensing the first insulating material on the bonding regions BR of the active surfaces 1121. The first insulating material may be an insulating material without fillers, a semi-cured epoxy resin, or other suitable insulating material. Next, an external energy such as heat and/or pressure is applied to the first insulating material to perform a curing process. In some embodiments, after curing, the first insulating encapsulant 140 may maintain a low viscosity to facilitate removal of voids. For example, the first insulating encapsulant 140 formed after the post-cure process has a coefficient of viscosity of the first insulating encapsulant 140 ranging from 10,000 to 80,000 mPas at 25 degrees Celsius. Through the above steps, the first insulating encapsulant 140 forms a cured product encapsulating the conductive wires 130 and having no molding defects (e.g. wire sweep or voids).

Figure 1D:
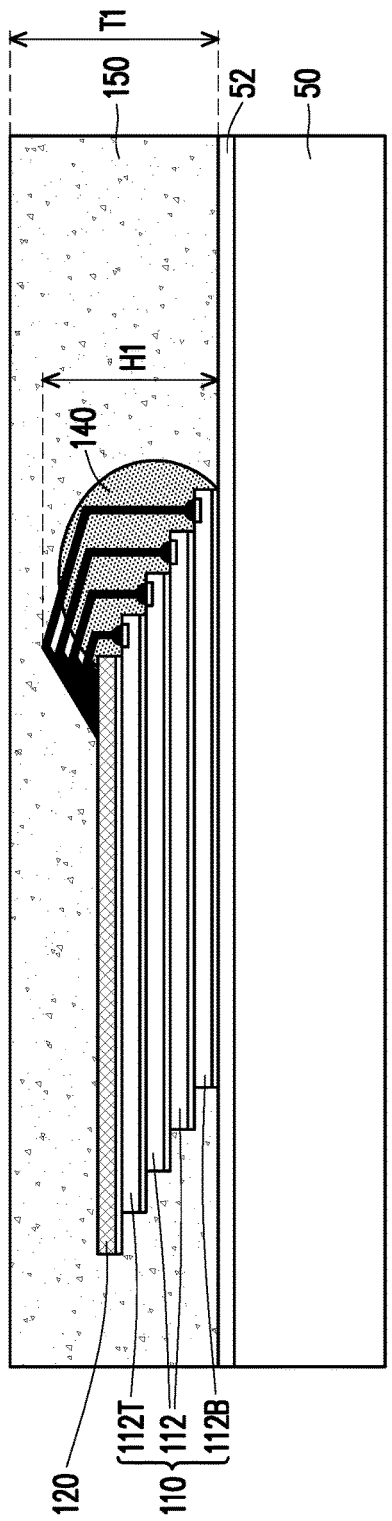

Referring to FIG. 1D, a second insulating encapsulant 150 is formed on the temporary carrier 50 to encapsulate the chip stack 110, the dummy spacer 120, and the first insulating encapsulant 140. For example, the second insulating encapsulant 150 may be a molding compound disposed using a molding process. A coefficient of viscosity of the first insulating encapsulant 140 may be lower than a coefficient of viscosity of the second insulating encapsulant 150. In some embodiments, after forming the second insulating encapsulant 150, a thickness T1 of the second insulating encapsulant 150 is greater than the wire arc heights H1 of the conductive wires 130. In some embodiments, the dummy spacer 120 disposed on the chip stack 110 may include the function of stabilizing the conductive wires 130 to alleviate the issue of wire sweep when forming the first insulating encapsulant 140 and the second insulating encapsulant 150.

Figure 1E:
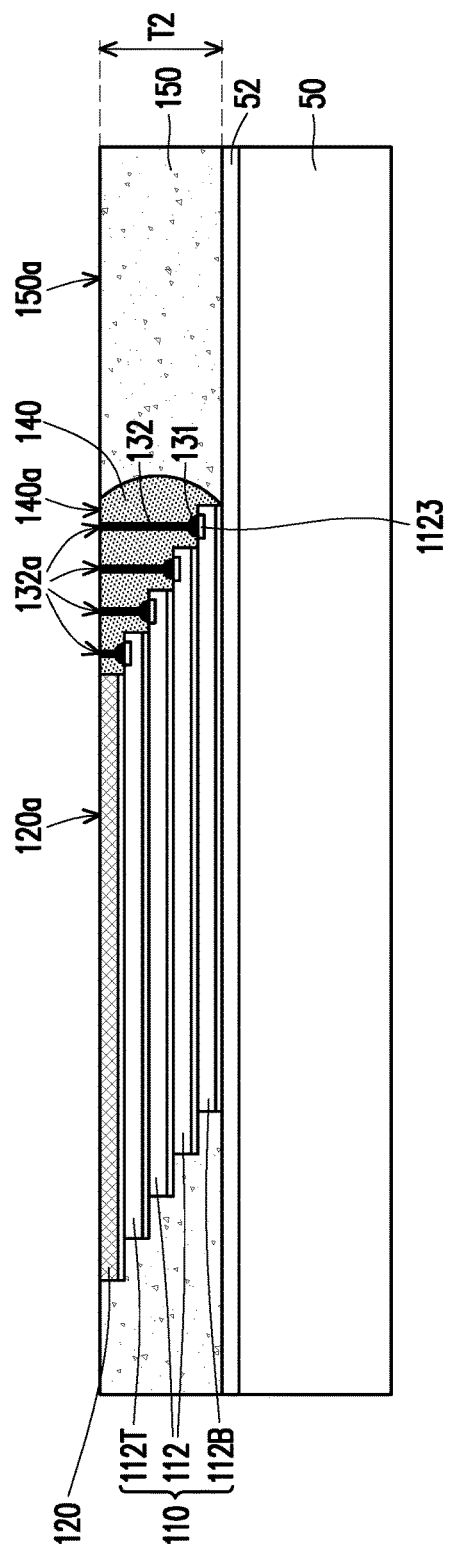

Referring to FIG. 1E, the thickness T1 of the second insulating encapsulant 150 is reduced to a thinned thickness T2. For example, the second insulating encapsulant 150 is grinded by a mechanical grinding process and/or a chemical mechanical polishing (CMP) process, or other suitable process. In some embodiments, the sacrificial segments 133 of the conductive wires 130 and the portion of the first insulating encapsulant 140 covering the sacrificial segments 133 are removed from the conductive wires 130 during the process such that the thickness of the first insulating encapsulant 140 is reduced. At least a portion of the conductive wires 130 may be exposed from the first insulating encapsulant 140. The first insulating encapsulant 140 may be exposed from the second insulating encapsulant 150. In other words, after reducing the thickness of the second insulating encapsulant 150, the bonding threads 131 and the vertical wire segments 132 of the conductive wires are laterally encapsulated by the first insulating encapsulant 140, and the first insulating encapsulant 140 is laterally encapsulated by the second insulating encapsulant 150.

In some embodiments, the dummy spacer 120 may be used as a buffer for grinding depth. In other words, the dummy spacer 120 provides a spacer function to prevent damage to the active surface 1121 (not stacked or covered) of the top semiconductor chip 112T from being grinded. For example, at least a portion the dummy spacer 120 may be grinded, so the active surface 1121 of the top semiconductor chip 112T is not damaged by the grinding process. In some embodiments, the second insulating encapsulant 150 is grinded until a surface 120a of the dummy spacer 120 and top surfaces 132a of the vertical wire segments 132 of the conductive wires 130 are exposed. In other words, after reducing the thickness of the second insulating encapsulant 150, a top surface 150a of the second insulating encapsulant 150 may be substantially a flat surface. For example, the top surface 150a of the second insulating encapsulant 150 is coplanar with the surface 120a of the dummy spacer 120, a surface 140a of the first insulating encapsulant 140 and the top surfaces 132a of the vertical wire segments 132 of the conductive wires 130. In some embodiments, after reducing the thickness of the second insulating encapsulant 150, the height of the vertical wire segments 132 is complementary to the stack height of the correspondingly bonded semiconductor chips 112. For example, the length of the vertical wire segments 132 formed on the bottom semiconductor chip 112B is greater than the length of the vertical wire segments 132 formed on the top semiconductor chip 112T.

Figure 1F:
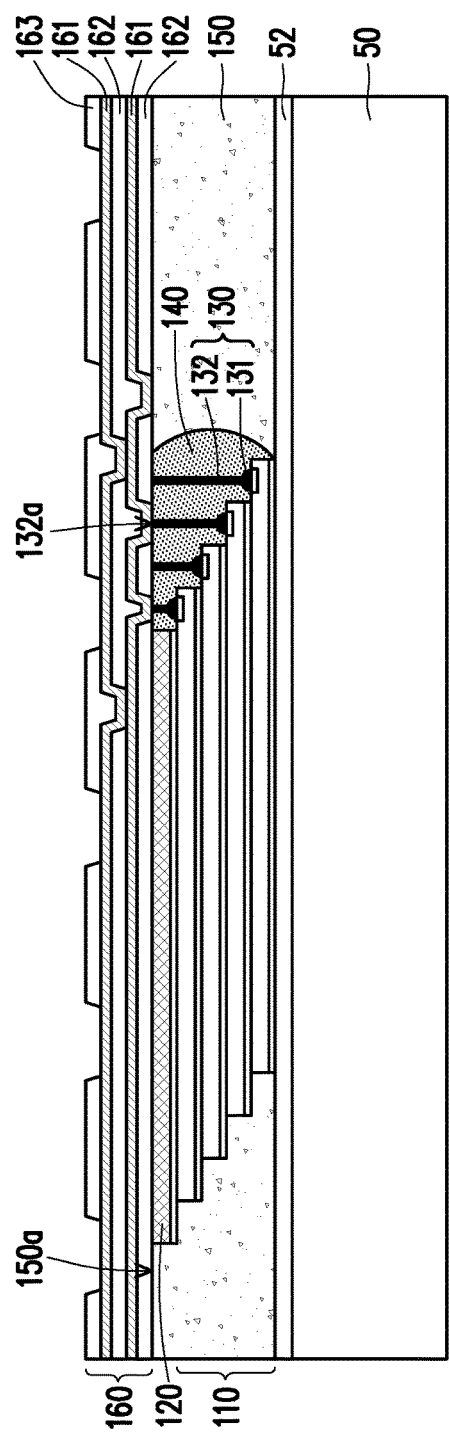

Referring to FIG. 1F, after the second insulating encapsulant 150 is thinned, a redistribution layer 160 is formed on the top surface 150a of the second insulating encapsulant 150, the first insulating encapsulant 140 and the dummy spacer 120 such that the active surfaces 1121 of the semiconductor chips 112 face toward the redistribution layer 160. In other words, the redistribution layer 160 is electrically coupled to the portion of the conductive wires 130 exposed from the first insulating encapsulant 140 and the second insulating encapsulant 150, and the active surfaces 1121 of the semiconductor chips 112 face toward the redistribution layer 160. For example, the redistribution layer 160 includes fan-out circuits 161, dielectric layers 162 alternately stacked on the fan-out circuits 161, and a passivation layer 163 disposed on the fan-out circuits 161. In some embodiments, the bottom layer of the dielectric layers 162 is formed on the top surface 150a of the second insulating encapsulant 150 and the dummy spacer 120. Accordingly, the dummy spacer 120 is encapsulated by the second insulating encapsulant 150 and the bottom layer of the dielectric layers 162, thereby enhancing resistance against peeling off.

The bottom layer of the dielectric layers 162 has a plurality of openings exposing at least a portion of the top surfaces 132a of the vertical wire segments 132 of the conductive wires 130. The bottom layer of the fan-out circuits 161 is formed in the openings and on the bottom layer of the dielectric layers 162 to electrically couple to the vertical wire segments 132 of the conductive wires 130 exposed from the openings. The fan-out circuits 161 may be a multi-layer metallic structure such as Ti/Cu/Cu or Ti/Cu/Cu/Ni/Au, etc., formed by sputtering and electroplating. In other words, the fan-out circuits 161 may include a combination of a bonding layer, a seed layer, and an electroplating layer. The abovementioned steps may be performed multiple times to obtain a multi-layered redistribution layer as required by the circuit design, which is not limited thereto. After forming the top layer of the fan-out circuits 161, the passivation layer 163 is formed on the top layer of the fan-out circuits 161 for protection. The dielectric layers 162 and the passivation layer 163 may be an organic insulating layer such as polyimide, or other suitable materials. In some embodiments, the passivation layer 163 has a plurality of openings exposing at least a portion of the fan-out circuits 161 for further electrical connection.

Figure 1G:
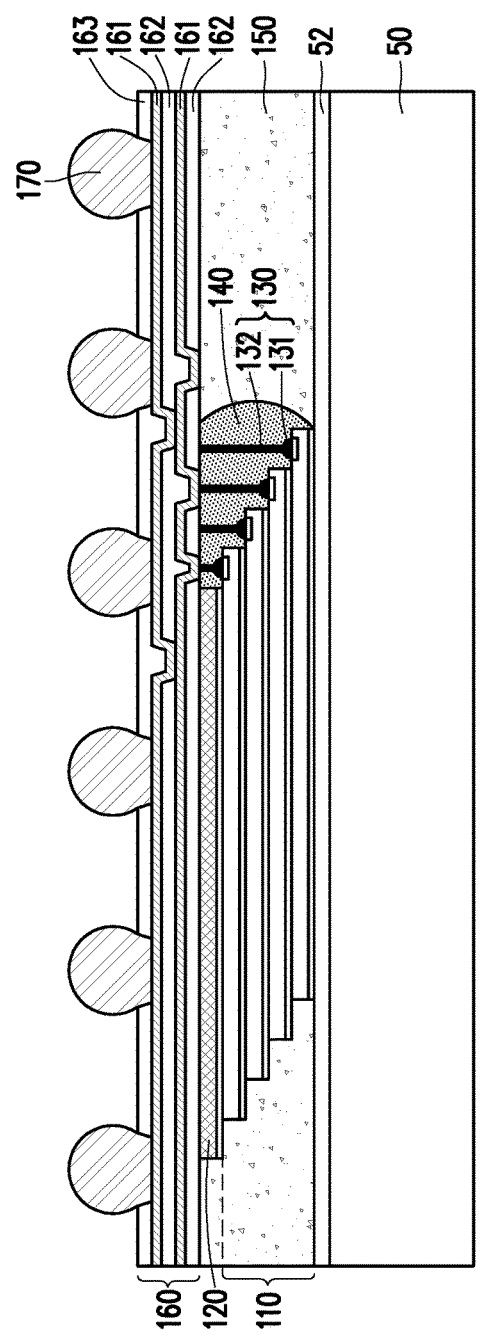

Referring to FIG. 1G, at least one conductive terminal 170 is formed on a surface of the redistribution layer 160 opposite to the second insulating encapsulant 150. The amount of the conductive terminal 170 construes no limitation in the disclosure, as long as the conductive terminal 170 is electrically coupled to the redistribution layer 160 to allow the communication between the chip stack 110 and the external electronic components (not illustrated). For example, the conductive terminals 170 are formed in the openings of the passivation layer 163 to electrically couple to the top layer of the fan-out circuits 161 of the redistribution layer 160 by a ball mounting process, a plating process, or other suitable process. The conductive terminals 170 may include conductive balls, conductive pillars, conductive bumps, or a combination thereof. However, it construes no limitation in the disclosure. Other possible forms and shapes of the conductive terminals 170 may be utilized according to the design requirement. In some embodiments, a soldering process and a reflowing process may be optionally performed for enhancement of the adhesion between the conductive terminals 170 and the redistribution layer 160.

Figure 1H:
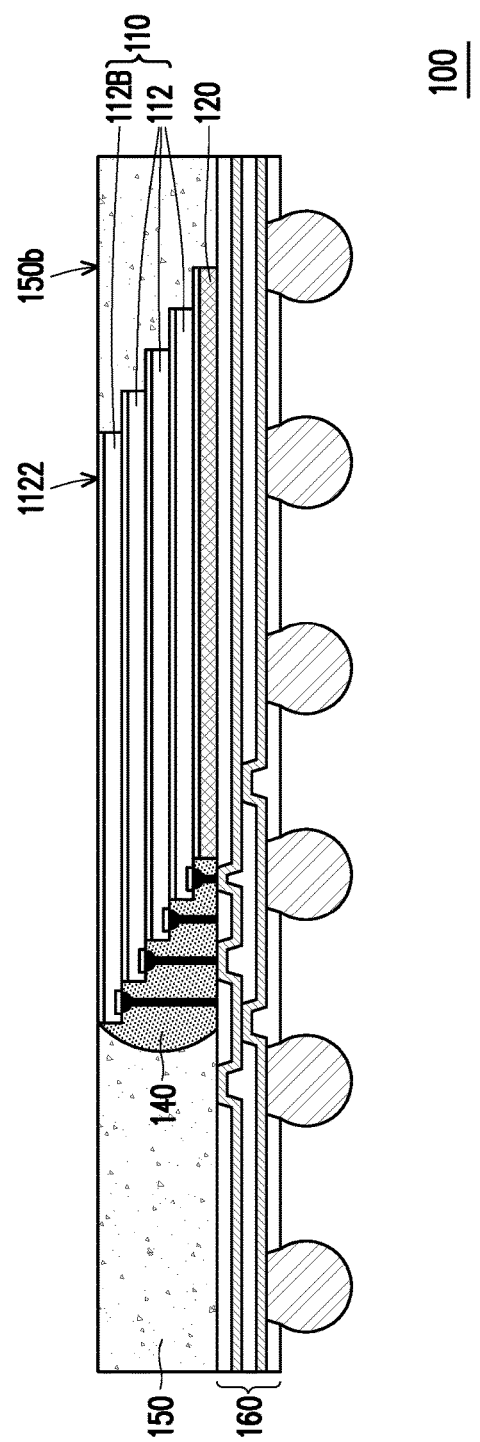

Referring to FIG. 1H, after forming the conductive terminals 170, the temporary carrier 50 is removed. For example, after applying UV irradiation to the release layer 52, the release layer 52 loses adhesivity and may be readily peeled off from the temporary carrier 50. After removing the temporary carrier 50, the back surface 1122 of the bottom semiconductor chip 112B is coplanar with a back surface 150b of the second insulating encapsulant 150 opposite to the top surface 150a. The manufacturing process of a semiconductor package 100 is substantially completed as shown in FIG. 1H.

FIG. 2A to FIG. 2E are cross-sectional views illustrating a manufacturing method of a semiconductor package according to an embodiment of the disclosure. The manufacturing method is similar with the manufacturing method described in FIG. 1A to FIG. 1H. The identical or similar numbers refer to the identical or similar elements throughout the drawings, and detail thereof is not repeated for brevity.

Figure 2A:
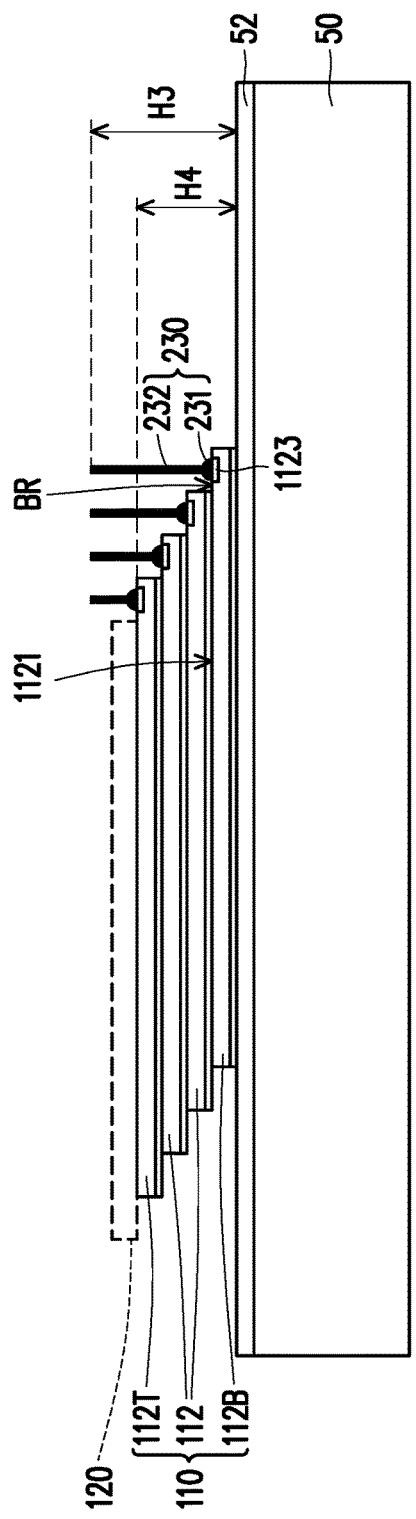
FIG. 2A to FIG. 2E are cross-sectional views illustrating a manufacturing method of a semiconductor package according to an embodiment of the disclosure.

Referring to FIG. 2A, the chip stack 110 is provided on the temporary carrier 50. The dummy spacer 120 is optionally disposed on the top semiconductor chip 112T. Accordingly, the dummy spacer 120 in FIG. 2A is illustrated as dashed to indicate that the dummy spacer 120 may or may not be present. In the embodiment in which the dummy spacer 120 is not disposed on the chip stack 110, the stacked amount of the semiconductor chips 112 and the thickness of the chip stack 110 may be increased. After disposing the chip stack 110, the conductive wires 230 are correspondingly formed on the bonding region BR. In the present embodiments, each of the conductive wires 230 formed as the straight vertical wire bond has a bonding thread 231 and a vertical wire segment 232 integrally connected to the bonding thread 231. The bonding threads 231 are bonded to the electrodes 1123 of the semiconductor chips 112, 112T and 112B. After forming the conductive wires 230, the height H3 of each conductive wire 230 measured from the bottom of the chip stack 110 is greater than the level height H4 of the top semiconductor chip 112T measured from the bottom of the chip stack 110. For example, the difference between the height H3 of each conductive wire 230 and the level height H4 of the top semiconductor chip 112T may range from about 20 μm to about 50 μm.

Figure 2B:
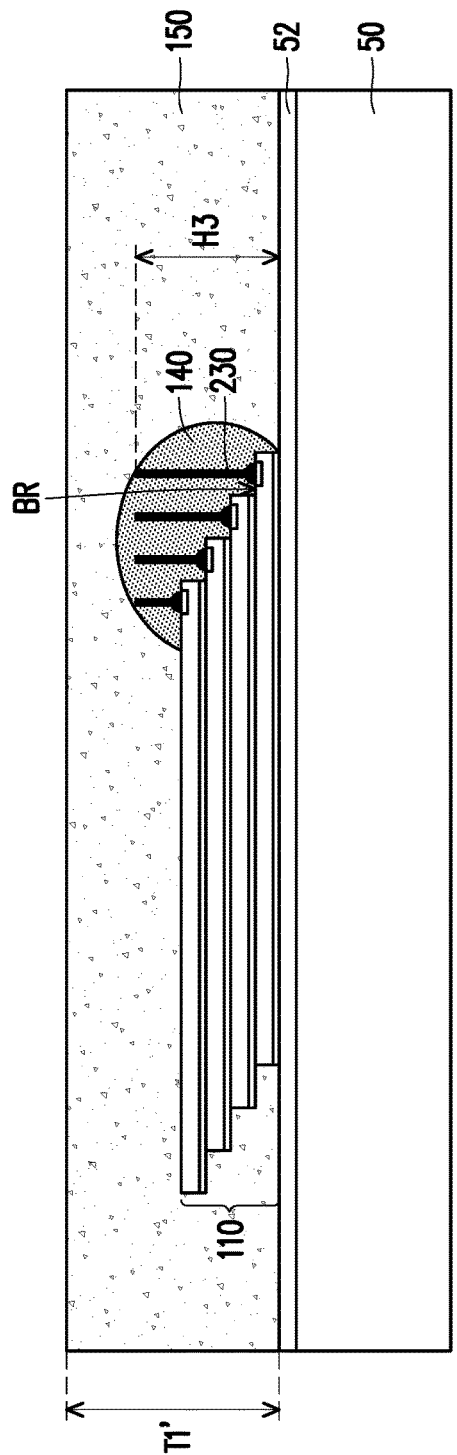

Referring to FIG. 2B, the first insulating encapsulant 140 is formed on the bonding region BR of the active surface 1121 of each of the semiconductor chips 112 to encapsulate the bonding region BR and the conductive wires 230. After forming the first insulating encapsulant 140, the second insulating encapsulant 150 is formed on the temporary carrier 50 to encapsulate the chip stack 110, and the first insulating encapsulant 140. The forming process of the first insulating encapsulant 140 and the second insulating encapsulant 150 is similar with the processes described above, and the detailed descriptions are omitted for brevity. After forming the second insulating encapsulant 150, the thickness T1' of the second insulating encapsulant 150 may be greater than the height H3 of each conductive wire 230 about 10 μm to about 50 μm to avoid touching the conductive wire 230 during compression molding.

Figure 2C:
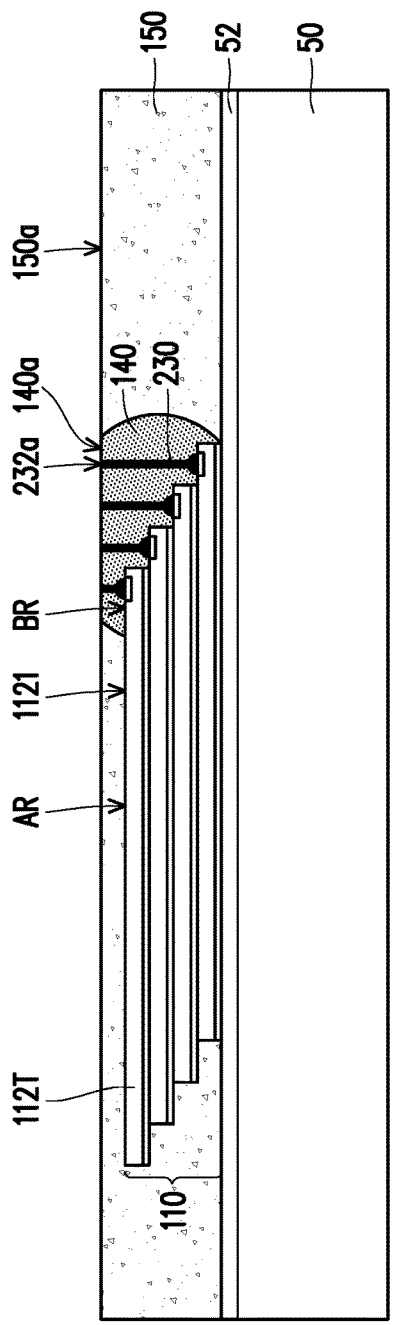

Referring to FIG. 2C, the thickness of the second insulating encapsulant 150 is reduced to expose the top surfaces 232a of the conductive wires 230. The thinning process of the second insulating encapsulant 150 is similar with the process described in FIG. 1E, and the detailed descriptions are omitted for brevity. In the present embodiment in which the dummy spacer is not disposed on the top semiconductor chip 112T, the first insulating encapsulant 140 covers the bonding region BR of the active surface 1211 of the top semiconductor chip 112T and the second insulting encapsulant 150 covers an area AR of the active surface 1211 connected to the bonding region BR of the top semiconductor chip 112T. After the thinning process, the top surface 150a of the second insulating encapsulant 150 is coplanar with the surface 140a of the first insulating encapsulant 140 and the top surfaces 232a of the conductive wires 230. In the embodiments in which the dummy spacer is disposed on the top semiconductor chip 112T, the dummy spacer used as a buffer for grinding depth may cover the active surface 1211 of the top semiconductor chip 112T, which is similar with the embodiment described in FIG. 1E.

Figure 2D:
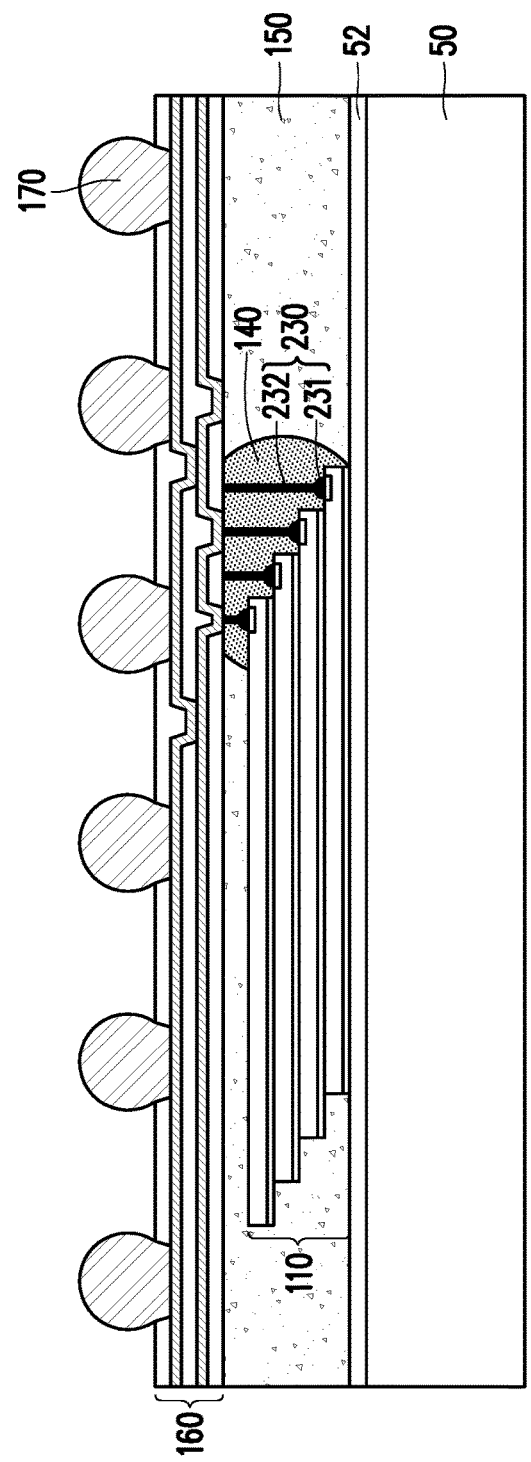

Referring to FIG. 2D, after reducing the thickness of the second insulating encapsulant 150, the redistribution layer 160 is formed on the top surface 150a of the second insulating encapsulant 150 and the first insulating encapsulant 140 to electrically couple to the conductive wires 230. After forming the redistribution layer 160, the conductive terminals 170 are formed on the redistribution layer 160 to electrically couple to the redistribution layer 160. The forming processes of the redistribution layer 160 and the conductive terminals 170 are similar with the processes described in FIG. 1F and FIG. 1G, and the detailed descriptions are omitted for brevity.

Figure 2E:
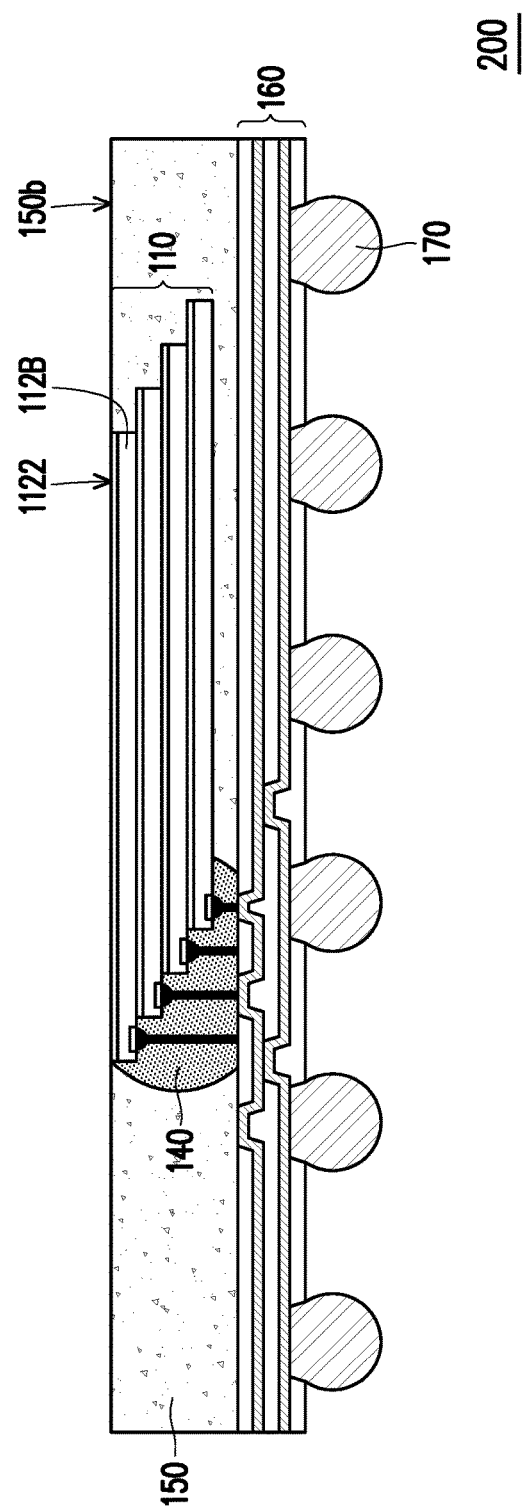

Referring to FIG. 2E, after forming the conductive terminals 170, the temporary carrier 50 is removed. For example, after applying UV irradiation to the release layer 52, the release layer 52 loses adhesivity and may be readily peeled off from the temporary carrier 50. After removing the temporary carrier 50, the back surface 1122 of the bottom semiconductor chip 112B is coplanar with the back surface 150b of the second insulating encapsulant 150. The manufacturing process of a semiconductor package 200 is substantially completed as shown in FIG. 2E.

FIG. 3A to FIG. 3F are cross-sectional views illustrating a manufacturing method of a semiconductor package according to an embodiment of the disclosure. The manufacturing method is similar with the manufacturing method described in FIG. 1A to FIG. 1H. The identical or similar numbers refer to the identical or similar elements throughout the drawings, and detail thereof is not repeated for brevity.

Figure 3A:
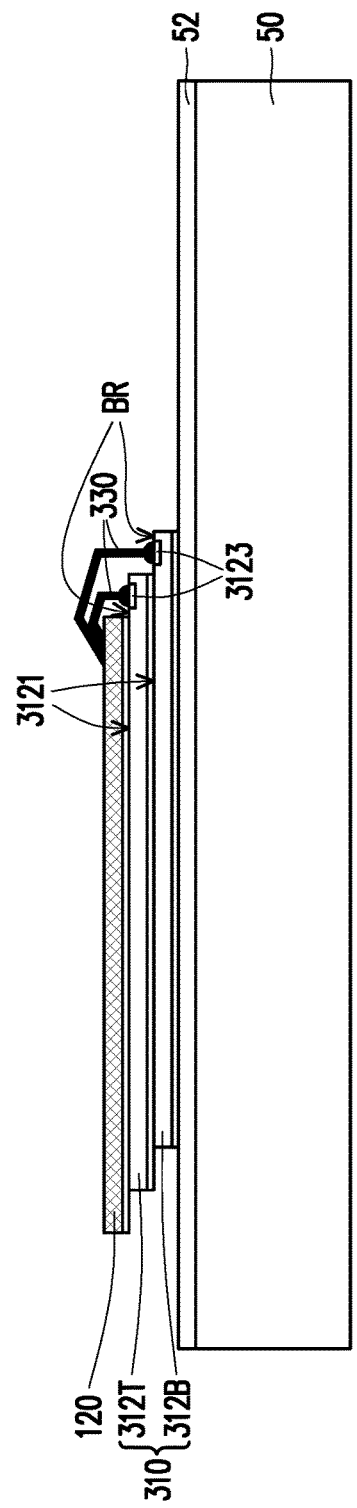
FIG. 3A and FIG. 3F are cross-sectional views illustrating a manufacturing method of a semiconductor package according to an embodiment of the disclosure.

Referring to FIG. 3A, a chip stack 310 is provided on the temporary carrier 50. The chip stack 310 includes a top semiconductor chip 312T and a bottom semiconductor chip 312B stacked on top of each other (e.g. stacked in a stepped offset manner or staggered stacking), which is similar with the chip stack 110. The top semiconductor chip 312T and the bottom semiconductor chip 312B have active surfaces 3121 correspondingly facing away from the temporary carrier 50. The electrodes 3123 are disposed on the bonding regions BR of the active surfaces 3121. The number of the semiconductor chips may be two or more, which is not limited thereto. The dummy spacer 120 is disposed on the active surface 3121 of the top semiconductor chip 312T and exposes the bonding regions BR of the top semiconductor chip 312T and the bottom semiconductor chip 312B. The conductive wires 330 are respectively formed to connect the dummy spacer 120 and the electrodes 3123 of the top semiconductor chip 312T and the bottom semiconductor chip 312B. The forming process of the conductive wires 330 is similar with that of the conductive wires 130, and the detailed descriptions are omitted for brevity.

Figure 3B:
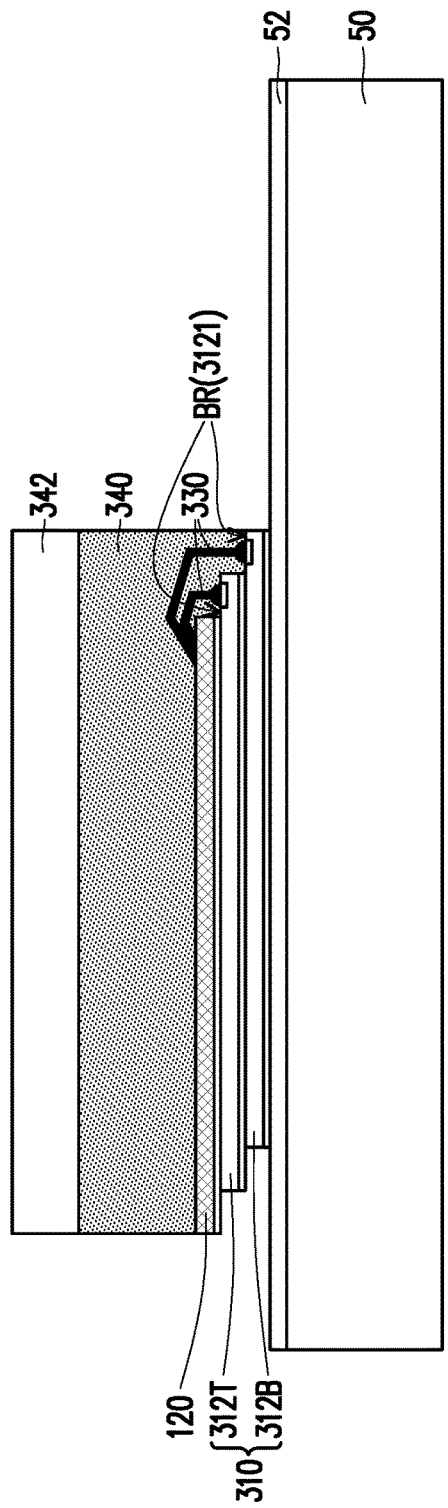

Referring to FIG. 3B, a first insulating encapsulant 340 is disposed on the dummy spacer 120 and the chip stack 310 to encapsulate the conductive wires 330 and the active surfaces 3121 of the top semiconductor chip 312T and the bottom semiconductor chip 312B. For example, the first insulating encapsulant 340 has a coefficient of viscosity ranging from about 10,000 to about 80,000 mPas at 25 degree Celsius. A material of the first insulating encapsulant 340 may include a film-over-wire (FOW) material, underfill, liquid epoxy molding compound, or other suitable material. A dummy die 342 (e.g. silicon spacer, substrate, or the like) may be used for holding the FOW.

For example, the first insulating encapsulant 340 in a semi-cured state is configured to cover the bonding regions BR of the active surfaces 3121 so that the conductive wires 330 may be embedded in the first insulating encapsulant 340. In some embodiments, the first insulating encapsulant 340 may further cover the dummy spacer 120 such that the conductive wires 330 connected between the dummy spacer 120 and the chip stack 310 are completely embedded in the first insulating encapsulant 340. To facilitate the embedding of the conductive wires 330, the external energy such as heat and/or pressure may be applied to the first insulating encapsulant 340 such that the first insulating encapsulant 340 can be malleable and mold itself around the conductive wires 330. Subsequently, the external energy is removed and the first insulating encapsulant 340 can be cured using a curing process including, but not limited to, a soft curing process and/or a hard curing process. Therefore, no gap, or substantially no void is formed between the first insulating encapsulant 340 and the dummy spacer 120, the chip stack 310 and the conductive wires 330 bonded therebetween. By employing the FOW process to embed the conductive wires 330 in the first insulating encapsulant 340, the conductive wires 330 can be provided additional support by the first insulating encapsulant 340 which may protect the conductive wires 330 from wire sweep or even breakage.

In some embodiments, after the first insulating encapsulant 340 is formed, the surface of the dummy spacer 120 and the side connected to the surface of the dummy spacer 120 are entirely covered by the first insulating encapsulant 340. The active surface 3121 of the top semiconductor chip 312T exposed from the dummy spacer 120 and the side of the top semiconductor chip 312T connected to the active surface 3121 are entirely covered by the first insulating encapsulant 340. The active surface 3121 of the bottom semiconductor chip 312B exposed from the top semiconductor chip 312T is entirely covered by the first insulating encapsulant 340 and the sides of the bottom semiconductor chip 312B are exposed from the first insulating encapsulant 340.

Figure 3C:
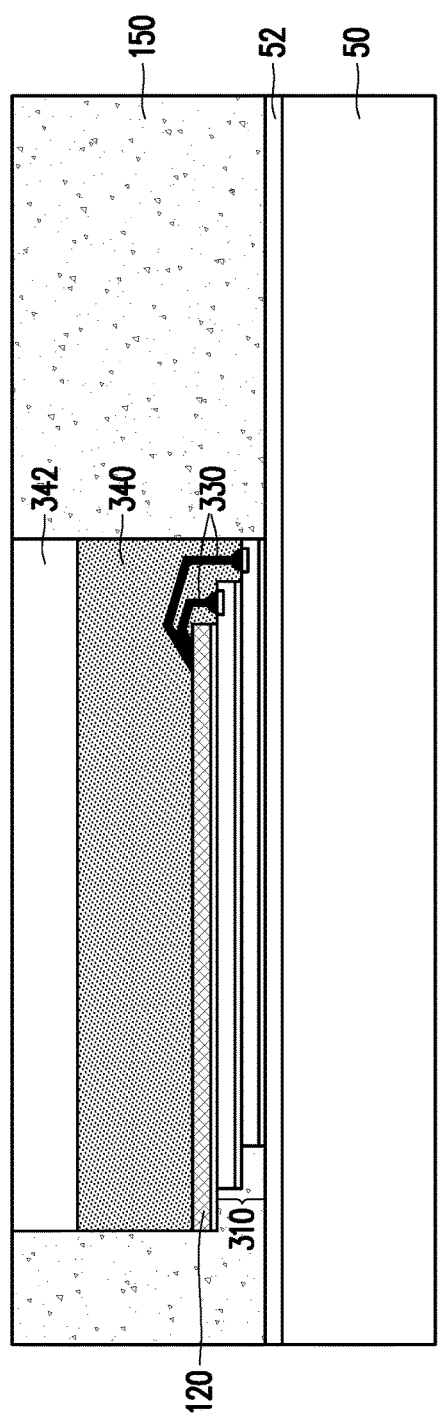

Referring to FIG. 3C, the second insulating encapsulant 150 is formed on the temporary carrier 50 to encapsulate the chip stack 310, the dummy spacer 120 and the first insulating encapsulant 340 by a molding process. The forming process of the second insulating encapsulant 150 of the present embodiment is similar with the forming process of the second insulating encapsulant 150 shown in FIG. 1D, and the detailed descriptions are omitted for brevity.

Figure 3D:
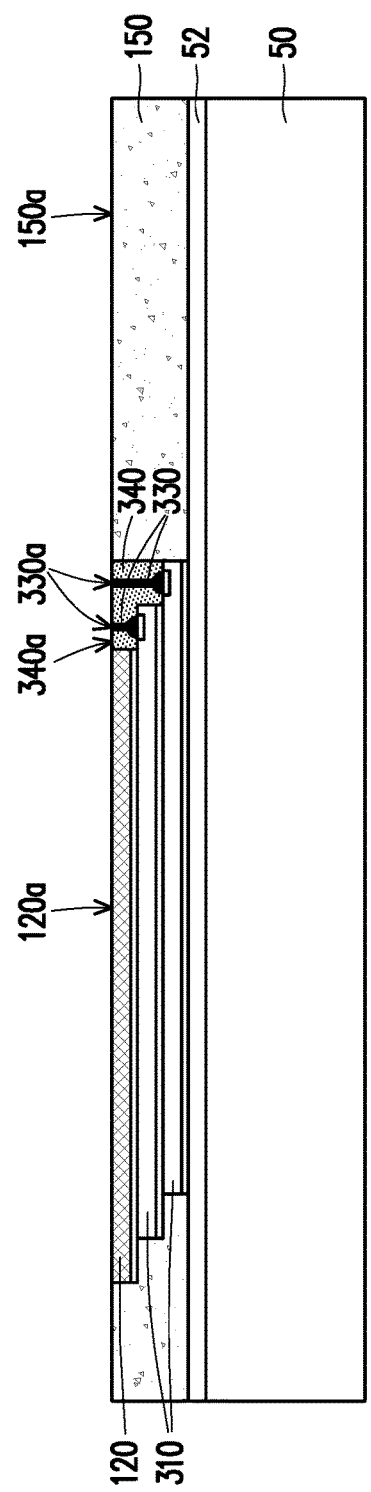

Referring to FIG. 3D, the thickness of the second insulating encapsulant 150 is reduced by a mechanical grinding process and/or a CMP process, or other suitable process. In some embodiments, the dummy die 342, a portion of the first insulating encapsulant 340 and a portion of the conductive wires 330 are also removed in the same process. In some other embodiments, a portion of the dummy spacer 120 is also grinded such that the first insulating encapsulant 340 only laterally covers the dummy spacer 120 and exposes the surface 120a of the dummy spacer 120. After the thinning process, the top surface 150a of the second insulating encapsulant 150 is coplanar with the surface 120a of the dummy spacer 120, a surface 340a of the first insulating encapsulant 340 and the top surfaces 330a of the conductive wires 330. If the residual of the first insulating encapsulant 340 is left on top surfaces 330a of the conductive wires 330, a cleaning process may be performed to remove the residual of the first insulating encapsulant 340. Due to the material property of the first insulating encapsulant 340, the undesired residual of the first insulating encapsulant 340 on the conductive wires 330 can be easily removed such that the issue of residual left on the top surfaces 330a of the conductive wires 330 may be eliminated.

Figure 3E:
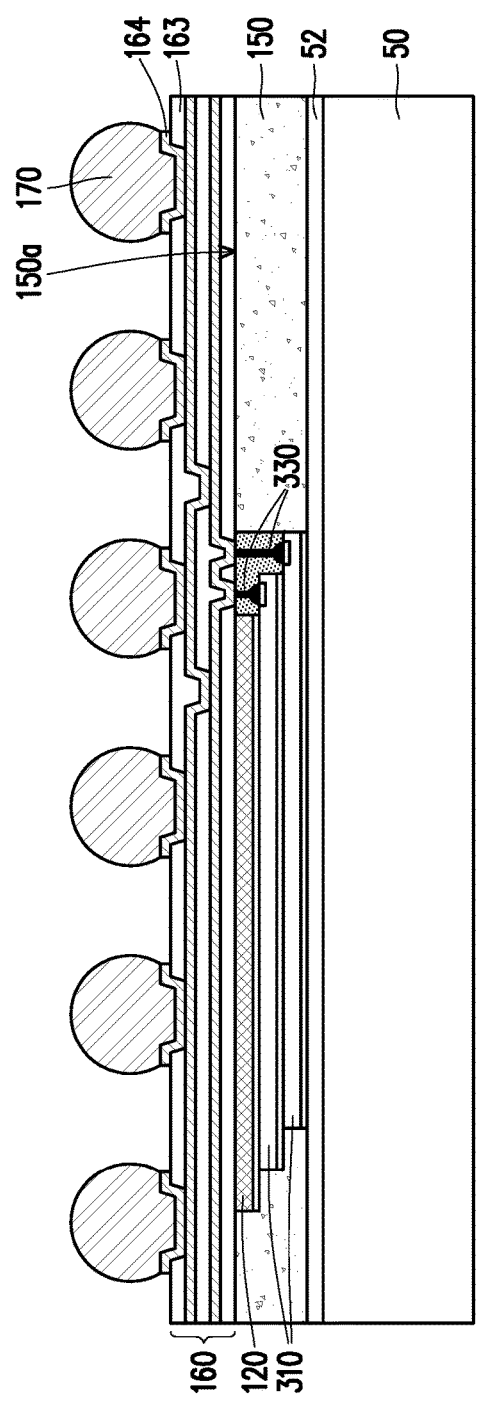

Referring to FIG. 3E, after reducing the thickness of the second insulating encapsulant 150, the redistribution layer 160 is formed on the surface 340a of the first insulating encapsulant 340 and the top surface 150a of the second insulating encapsulant 150 to electrically couple to the conductive wires 230. The forming processes of the redistribution layer 160 is similar with the forming process described in FIG. 1F. In the present embodiment, after forming the passivation layer 163, a plurality of terminal bearings 164 may be formed in the openings of the passivation layer 163 to electrically couple to the top layer of the fan-out circuits 161. The terminal bearings 164 may include under-bump metallization (UBM) and may be formed by materials such as nickel, copper, or other suitable material. Subsequently, the conductive terminals 170 are formed on the terminal bearings 164 to electrically couple to the redistribution layer 160. The terminal bearings 164 may strengthen the bonding of the conductive terminals 170 and the fan-out circuits 161.

Figure 3F:
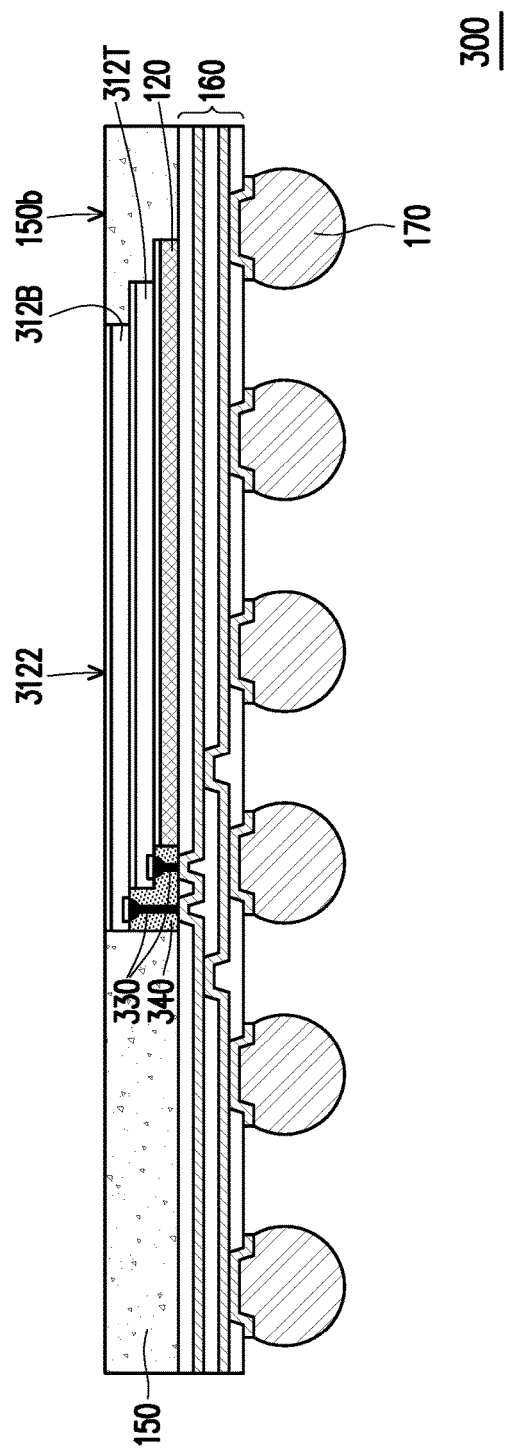

Referring to FIG. 3F, after forming the conductive terminals 170, the temporary carrier 50 is removed by peeling off the release layer 52. After removing the temporary carrier 50, the back surface 3122 of the bottom semiconductor chip 312B is coplanar with the back surface 150b of the second insulating encapsulant 150. The manufacturing process of a semiconductor package 300 is substantially completed as shown in FIG. 3F.

Figure 4A:
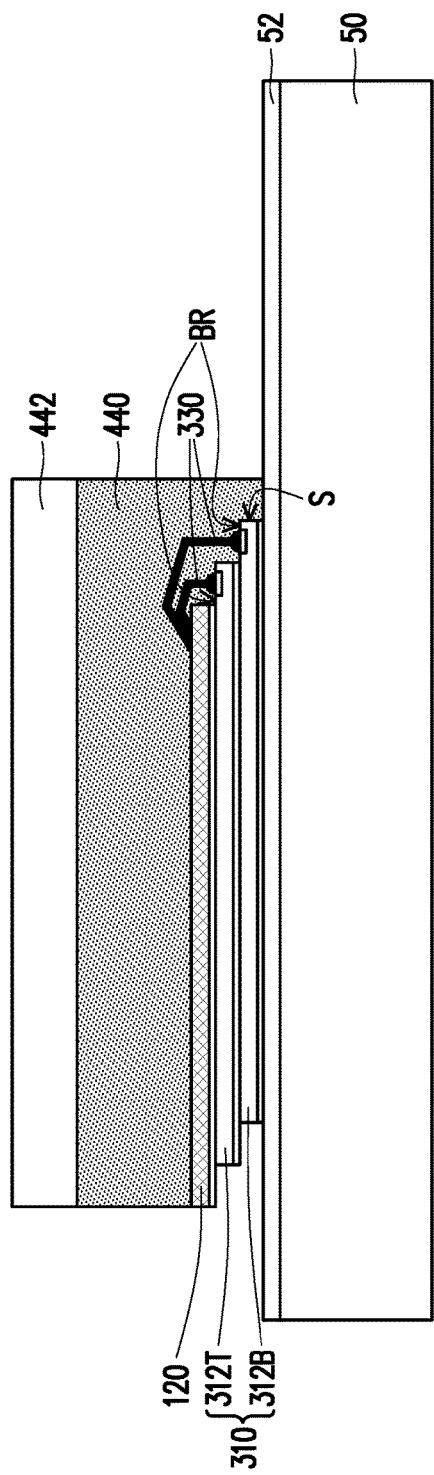
FIG. 4A and FIG. 4B are cross-sectional views illustrating a manufacturing method of a semiconductor package according to an embodiment of the disclosure.
Figure 4B:
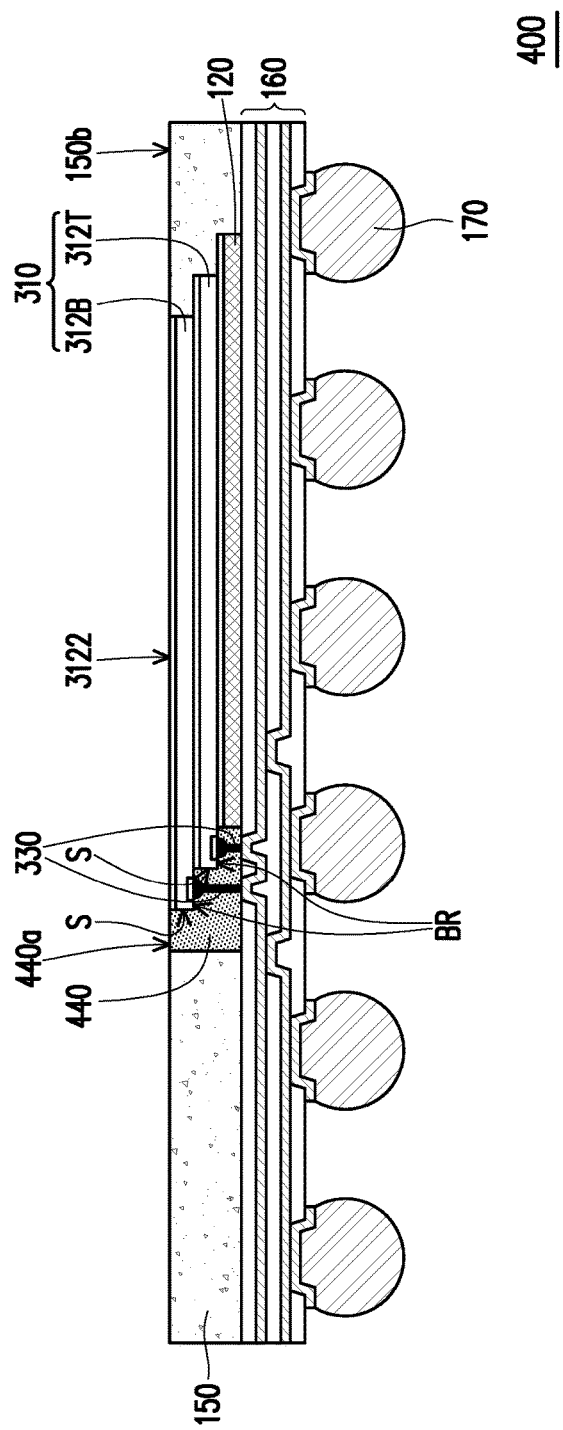

FIG. 4A and FIG. 4B are cross-sectional views illustrating a manufacturing method of a semiconductor package according to an embodiment of the disclosure. The manufacturing method is similar with the manufacturing method described in FIG. 3A to FIG. 3F. Referring to FIG. 4A and FIG. 4B, the different of the present embodiment and the embodiment shown in FIG. 3A to FIG. 3F lies in that at the step of forming the first insulating encapsulant 440, the first insulating encapsulant 440 may be disposed on the temporary carrier 50 to cover the dummy spacer 120 and the chip stack 310 such that the conductive wires 330, the active surfaces 3121 of the top semiconductor chip 312T and the bottom semiconductor chip 312B, and at least one side S of the bottom semiconductor chip 312B are encapsulated by the first insulating encapsulant 440.

After forming the first insulating encapsulant 440, the second insulating encapsulant 150, the redistribution layer 160 and the conductive terminals 170 are sequentially formed, and the forming processes are similar with the processes shown in FIG. 3C to FIG. 3F so that the detailed descriptions are omitted for brevity. Referring to FIG. 4B, the semiconductor package 400 is presented. The first insulating encapsulant 440 covers the bonding regions BR of the top semiconductor chip 312T and the bottom semiconductor chip 312B. In some embodiments, the first insulating encapsulant 440 may further cover the sides S connected to the bonding regions BR of the top semiconductor chip 312T and the bottom semiconductor chip 312B. In some embodiments, a surface 440a of the first insulating encapsulant 440 is coplanar with the back surface 3122 of the bottom semiconductor chip 312B and the back surface 150b of the second insulating encapsulant 150.

Based on the above, the semiconductor package provided by the disclosure is able to achieve the semiconductor package miniaturization. The overall package thickness is very close to the chip stack height. Moreover, the first insulating encapsulant is formed to encapsulate the conductive wires formed on the bonding regions of the active surfaces of the semiconductor chips prior to forming the second insulating encapsulant. Therefore, the first insulating encapsulant may protect the conductive wires from resulting in the issue of wire sweep when forming the second insulating encapsulant. In addition, due to the material property of the first insulating encapsulant, the redundant of the first insulating encapsulant can be easily removed such that the issue of insulating residual left on the top surfaces of the conductive wires may be eliminated, thereby preventing the resistance and fusing current of the redistribution layer from decreasing. Accordingly, the fabrication of the semiconductor package would result in better stability and yield.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor package, comprising:
   a chip stack comprising a plurality of semiconductor chips stacked on top of each other, each of the semiconductor chips having an active surface, the active surface having at least one bonding region, and each of the at least one bonding region exposed by the chip stack;
   at least one conductive wire correspondingly disposed on the at least one bonding region;
   a first insulating encapsulant encapsulating the at least one bonding region and the at least one conductive wire, at least a portion of each of the at least one conductive wire is exposed from the first insulating encapsulant;
   a second insulating encapsulant encapsulating the chip stack and the first insulating encapsulant, wherein the first insulating encapsulant is exposed from the second insulating encapsulant; and
   a redistribution layer disposed on the first insulating encapsulant and the second insulating encapsulant, wherein the redistribution layer is electrically coupled to the at least one conductive wire.

2. The semiconductor package according to claim 1, wherein a coefficient of viscosity of the first insulating encapsulant is lower than a coefficient of viscosity of the second insulating encapsulant.

3. The semiconductor package according to claim 1, wherein a surface of the first insulating encapsulant is coplanar with a surface of the second insulating encapsulant in contact with the redistribution layer.

4. The semiconductor package according to claim 1, further comprising:
   a dummy spacer disposed between the chip stack and the redistribution layer and laterally encapsulated by the second insulating encapsulant, wherein the at least one bonding region is exposed by the dummy spacer.

5. The semiconductor package according to claim 4, wherein a surface of the dummy spacer is coplanar with a surface of the first insulating encapsulant and a surface of the second insulating encapsulant.

6. The semiconductor package according to claim 1, wherein a top semiconductor chip of the chip stack has an area connected to the at least one bonding region, and the second insulating encapsulant covers the area of the top semiconductor chip of the chip stack.

7. The semiconductor package according to claim 1, further comprising:
   at least one conductive terminal disposed on the redistribution layer opposite to the second insulating encapsulant and electrically coupled to the redistribution layer.

8. The semiconductor package according to claim 1, wherein each of the semiconductor chips of the chip stack has a side connected to the active surface, and the first insulating encapsulant covers the side of each of the semiconductor chips.

9. The semiconductor package according to claim 8, wherein a bottom semiconductor chip of the chip stack away from the redistribution layer has a back surface opposite to the active surface, the back surface of the bottom semiconductor chip is coplanar with a surface of the first insulating encapsulant and a surface of the second insulating encapsulant.

10. A manufacturing method of a semiconductor package, comprising:
    providing a chip stack, wherein the chip stack comprises a plurality of semiconductor chips stacked on top of each other, each of the semiconductor chips has an active surface, the active surface having at least one bonding region, and each of the at least one bonding region exposed by the chip stack;
    forming at least one conductive wire correspondingly on the at least one bonding region;
    forming a first insulating encapsulant to encapsulate the at least one bonding region and the at least one conductive wire;
    forming a second insulating encapsulant to encapsulate the chip stack and the first insulating encapsulant, wherein the first insulating encapsulant is exposed from the second insulating encapsulant; and
    forming a redistribution layer on the first insulating encapsulant and the second insulating encapsulant, wherein the redistribution layer is electrically coupled to the at least one conductive wire.

11. The manufacturing method according to claim 10, further comprising:
    disposing a dummy spacer on the active surface of a top semiconductor chip of the chip stack before forming the at least one conductive wire, wherein the at least one bonding region of the top semiconductor chip is exposed by the dummy spacer.

12. The manufacturing method according to claim 11, wherein forming the at least one conductive wire comprises:
    forming the at least one conductive wire connected between the chip stack and the dummy spacer through a wire bonding process.

13. The manufacturing method according to claim 11, wherein after forming the second insulating encapsulant, the dummy spacer is encapsulated by the second insulating encapsulant.

14. The manufacturing method according to claim 11, wherein after forming the second insulating encapsulant, reducing a thickness of the first insulating encapsulant and a thickness of the second insulating encapsulant, after the thicknesses of the first insulating encapsulant and the second insulating encapsulant are reduced, a surface of the dummy spacer is coplanar with a surface of the first insulating encapsulant and a surface of the second insulating encapsulant.

15. The manufacturing method according to claim 10, wherein after forming the second insulating encapsulant, reducing a thickness of the first insulating encapsulant and a thickness of the second insulating encapsulant, after the thicknesses of the first insulating encapsulant and the second insulating encapsulant are reduced, a surface of the first insulating encapsulant is coplanar with a surface of the second insulating encapsulant covering the active surface of a top semiconductor chip of the chip stack.

16. The manufacturing method according to claim 10, wherein a coefficient of viscosity of the first insulating encapsulant is lower than a coefficient of viscosity of the second insulating encapsulant, forming the first insulating encapsulant comprises:
    disposing a first insulating material on the chip stack; and
    curing the first insulating material by applying an external energy to form the first insulating encapsulant.

17. The manufacturing method according to claim 10, further comprising:
    forming at least one conductive terminal on the redistribution layer opposite to the second insulating encapsulant to electrically couple to the redistribution layer.

18. The manufacturing method according to claim 10, wherein each of the semiconductor chips of the chip stack has a side connected to the at least one bonding region, and after forming the first insulating encapsulant, the first insulating encapsulant covers the side of each of the semiconductor chips.

19. The manufacturing method according to claim 10, further comprising:
    providing a temporary carrier, wherein the chip stack is disposed on the temporary carrier; and
    removing the temporary carrier after forming the redistribution layer, wherein a bottom semiconductor chip of the chip stack away from the redistribution layer has a back surface opposite to the active surface, and after the temporary carrier is removed, the back surface of the bottom semiconductor chip is coplanar with a surface of the second insulating encapsulant.

20. The manufacturing method according to claim 19, wherein after removing the temporary carrier, a surface of the first insulating encapsulant is coplanar with the back surface of the bottom semiconductor chip and the surface of the second insulating encapsulant.

* * * * *